United States Patent [19]

Theall, Jr. et al.

[11] Patent Number: 4,621,242

[45] Date of Patent: Nov. 4, 1986

[54] R.F. IMPEDANCE MATCH CONTROL SYSTEM

[75] Inventors: C. Earle Theall, Jr., Weston; Hans G. Ludwig, Norwalk, both of Conn.; Michael J. Gustin, Bedford Hills, N.Y.

[73] Assignee: The Perkin-Elmer Corporation, Norwalk, Conn.

[21] Appl. No.: 590,933

[22] Filed: Mar. 19, 1984

[51] Int. Cl.$^4$ ............................................. H03H 7/40
[52] U.S. Cl. ................................... 333/17 M; 333/32
[58] Field of Search ..................... 333/17 M, 17 R, 32; 455/125, 123, 121, 120, 115, 107; 343/703, 860, 861

[56] References Cited

U.S. PATENT DOCUMENTS

| | | | |
|---|---|---|---|
| 3,601,717 | 8/1971 | Kuecken | 455/125 X |
| 3,775,707 | 11/1973 | Frazier | 333/32 |
| 3,842,358 | 10/1974 | Frazier | 455/115 X |
| 3,870,957 | 3/1975 | Straw | 455/115 X |
| 4,015,223 | 3/1977 | Chezl | 333/17 M |
| 4,375,051 | 2/1983 | Theall | 333/17 M |

Primary Examiner—Eugene R. LaRoche
Assistant Examiner—Benny Lee
Attorney, Agent, or Firm—Thomas P. Murphy; Edwin T. Grimes; Francis L. Masselle

[57] ABSTRACT

An R.F. impedance match control system. The reflection coefficient of the system is compared to a threshold to determine a mismatch condition which is corrected by selectively changing in incremental steps the turns ratio of an autotransformer provided at the input to the load until the mismatch condition is corrected. Timing means are provided to delay each mismatch correction until initial transient conditions are stabilized and to shut off R.F. power during each turns ratio change.

8 Claims, 3 Drawing Figures

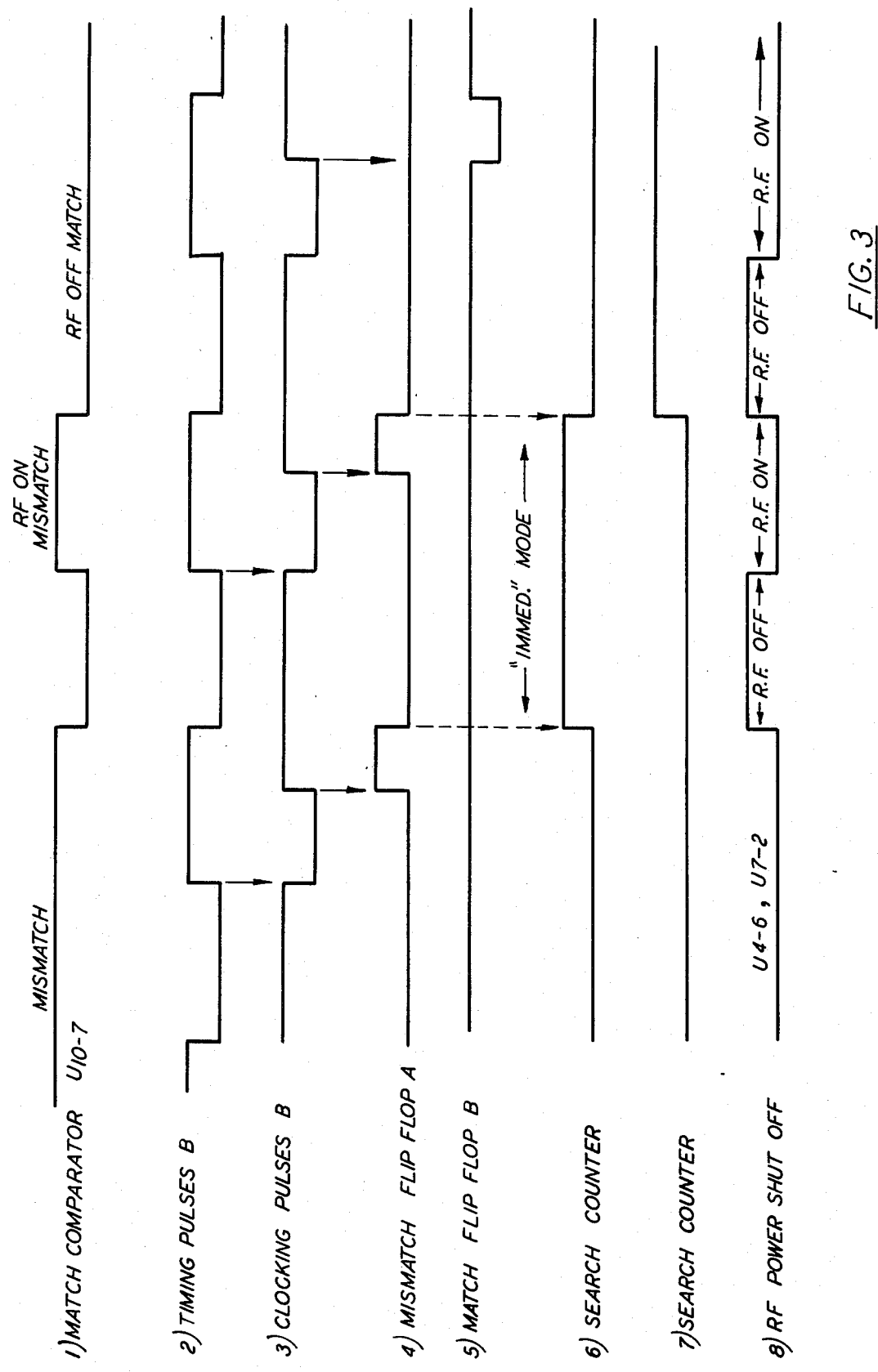

R.F. IMPEDANCE MATCH CONTROL SYSTEM

BACKGROUND OF THE INVENTION

In the field of power transmission, efficient transmission of power from a power source to a load requires that impedance at the load be reasonably matched to the characteristic impedance of the transmission line which connects power source to load. Such a match is desirable not only from the point of view of efficiency but also to prevent damage to the power source due to the reflected power caused by a mismatch.

The problem of mismatch is one of long standing and has been solved in various ways. For example, one type of system senses mismatch and varies the gain of the power source accordingly. Another type of system changes the impedance of the load until the mismatch is corrected. Most of these systems work well in their environment which may be, e.g., supplying R.F. power to a transmitting antenna.

The present invention is an R.F. impedance match control system ideally suited for use in plasma etching systems wherein mismatch detection and correction is done in time controlled sequences.

BRIEF SUMMARY OF THE INVENTION

In its simplest form the R.F. impedance match control system of the present invention couples an R.F. generator to a load via a bi-directional coupler which provides output voltages proportional to forward and reflected voltages. Divider means obtain the reflection coefficient of the system which is then compared with a set threshold voltage to determine if a mismatch condition exists. If a mismatch condition exists, the turns ratio of an autotransformer is varied until the mismatch condition is corrected.

More particularly, the present invention relates to an impedance match control system in which a mismatch condition is sensed and corrected in controlled time sequence to cause the mismatch condition to be sensed during a first time segment and corrected during a second time segment. The first time segment is time delayed a predetermined amount after R.F. power is turned on to permit transients to stabilize. Power is turned off during the second time segment when correction of the mismatch takes place.

In carrying out the present invention the voltage representative of a mismatch is applied to flip-flop which is set by a clock pulse at the end of a clock pulse if a mismatch exists. On reset after a predetermined time the flip-flop advances a match counter changing its binary output. This change causes the turns ratio of the autotransformer to be changed to effect a change in the load seen by the R.F. power source. During this change R.F. power is turned off. After the change in impedance, power is turned on and the cycle is repeated until a match is obtained.

The foregoing match control may be made to occur in an immediate mode as just described or in a delayed mode wherein a mismatch has to be detected a predetermined number of successive times before a match correction is made. This curtails responses to false indications of a mismatch. Thus use of the delayed mode eliminates unnecessary or excessive disconnections of the R.F. power source from the load and permits a match cycle to occur only after a preset number of successive mismatch signals are sensed.

Another feature of the present invention is circuitry which keeps track of the number of trials made in changing turns ratio of the autotransformer. After a preset number of sets of trials, it may statistically be decided that the apparent mismatch is caused by circuit problems other than a mismatch and the R.F. power is turned off as a circuit protective measure.

A further feature of the invention utilizes the phase of the reflection coefficient to cause the match counter to count in the appropriate direction to permit the turns ratio of the autotransformer to be changed in a more efficient manner rather than cycling through in the same direction without regard to the most efficient direction, i.e., a higher or lower turns ratio.

BRIEF DESCRIPTION OF THE DRAWINGS

FIG. 3 is a timing diagram useful in understanding the operation of the present invention.

DESCRIPTION

Figure 1:
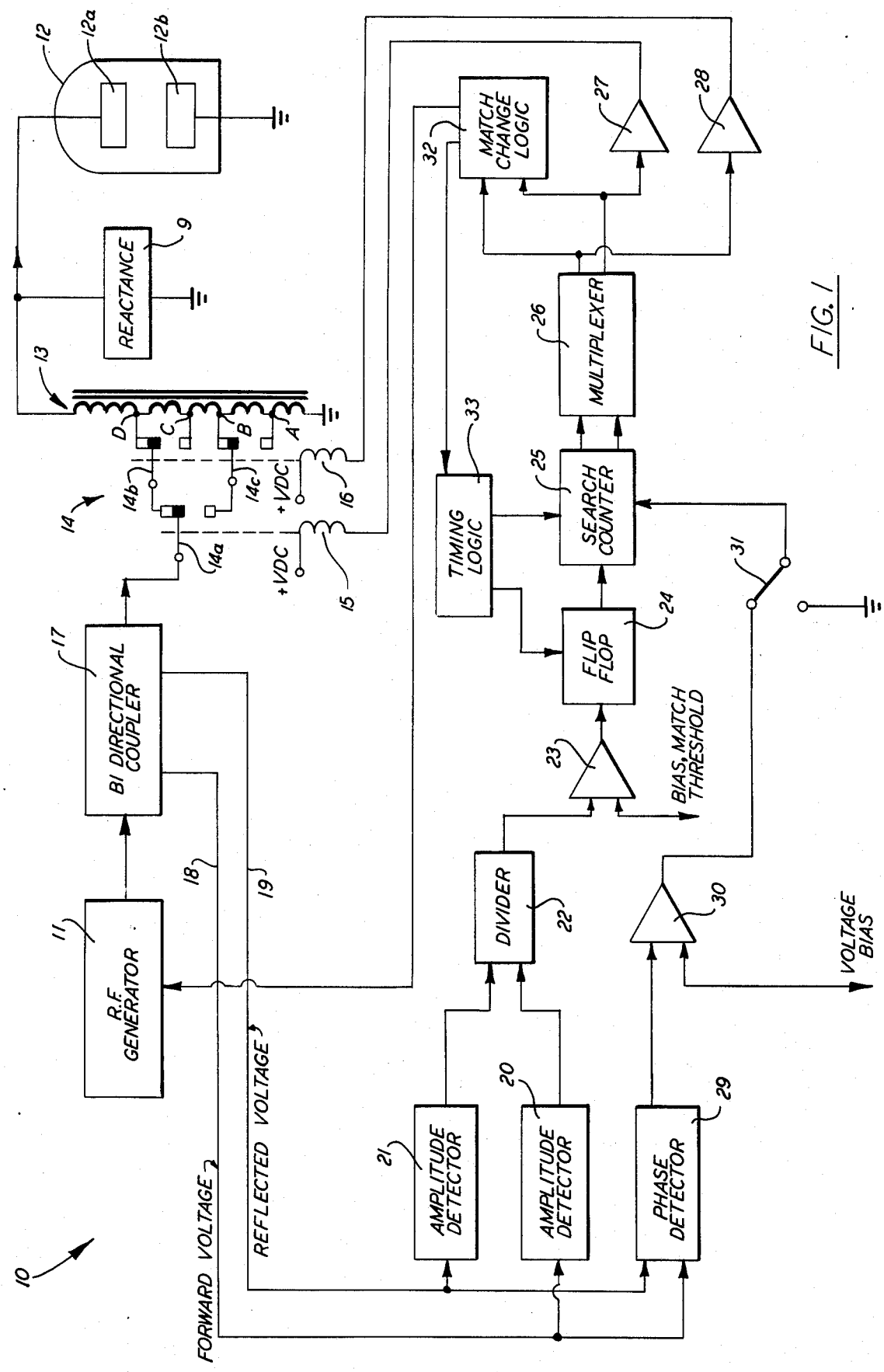
FIG. 1 is a block diagram of the impedance match control system of the present invention.

Referring now more particularly to FIG. 1 there is shown the R.F. impedance match control system 10 of the present invention.

Impedance match control system comprises an R.F. generator 11 connected to a load, e.g., the anode 12a in a plasma chamber 12. The plasma chamber 12 together with the anode 12a and a grounded cathode 12b is capable of generating a plasma within chamber 12 for the dry etching of various types of wafer coatings, e.g., photoresist, aluminum and various metals normally used in the fabrication of integrated circuits. The parameters necessary to etch the various coatings on the surface of the wafer such as power, frequency, etching gases and pressure within a plasma chamber similar to plasma chamber 12 are well known in the art and are, therefore, not described here.

It is also well known that a load which is powered by an R.F. generator often has an impedance match problem which for the sake of efficiency and circuit protection, particularly of the R.F. generator, must be compensated. The present invention employs an autotransformer 13 to correct the mismatch. The autotransformer 13 shown has four taps A–D although, obviously more may be used. However, in a particular working environment four taps which provide four different ratios were found to adequately compensate for mismatches. As can be seen in FIG. 1, a connection of power to tap A provides the greatest step up in apparent impedance of the load while a connection of power to tap D provides the least step up in load impedance. Taps B and C provide other intermediate variations in the amount of load impedance. Reactance 9 is an inductance which parallel tunes out the capacitance of chamber 12 making the chamber impedance resistive.

The taps are selected by a dual switch arrangement 14 having a single two pole switch 14a and double two pole switches 14b and 14c operated by solenoids 15 and 16, respectively. As can be seen in FIG. 1, when switch 14a is in the top contact position, switch 14b can select taps D or C. When switch 14a is in the bottom contact position, switch 14c can select taps A or B. Switch 14a is actuated by solenoid 15 while switches 14b and 14c are actuated by solenoid 16. The arrangement which ultimately senses a mismatch and operates solenoids 15 and 16 is a unique combination having the essential features which make up the present invention and is more fully described hereinbelow.

The R.F. generator 11 is coupled to the load 12 or more correctly to the transmission line which is connected to the load via bi-directional coupler 17. The bi-directional coupler 17 is a conventional commercial item whose circuit parameters depend on the frequency of the R.F. generator used. In a practical embodiment one such frequency is 13.56 MHZ. For such a frequency an appropriate bi-directional coupler is the ANZAC CH-130-4. If as in other embodiments a frequency of 100 KHZ is used, then an appropriate bi-directional coupler is the MERRIMAC CRN-30-.345/27151.

The terminals 18 and 19 connect the voltages proportional to forward and reflected voltages, respectively, to amplitude detectors 20 and 21. Amplitude detectors 20 and 21 convert the forward and reflected R.F. voltages to d.c. voltages which have levels proportional to the R.F. amplitude. The outputs of amplitude detectors 20 are connected to divider 22 which divides the voltage representative of reflected voltage by the voltage representative of forward voltage to provide an output voltage proportional to the reflection coefficient.

The voltage proportional to the reflection coefficient is applied to a comparator 23 which has a second input threshold voltage representative of an acceptable match condition. If the voltage representative of the reflection coefficient is less than the threshold voltage, a matched condition exists and no correction is required.

On the other hand if the reflection coefficient voltage is greater than the threshold voltage, a mismatch condition is existent and a high appears as an output from comparator 23 and is applied to mismatch flip-flop 24. The terms "high" and "low" throughout this description refer to high voltage and low voltage, respectively. When a high exists at the input to mismatch flip-flop 24, timing logic causes the flip-flop 24 to be set and then reset. The output terminal of flip-flop 24 is connected to search counter 25 which is advanced one count by the reset of flip-flop 24. The search counter 25 provides a two bit binary output which is applied via multiplexer 26 to relay drivers 27 and 28 which energize one or the other or both of solenoids 15 and 16 to change the turns ratio of autotransformer 13 by one step. If this change results in a match, the high at the output of comparator 23 goes low and nothing further is done until another mismatch occurs. On the other hand, if the change in the turns ratio of autotransformer 13 does not result in a match, the cycle is repeated, the binary output from search counter 25 is changed by one and the turns ratio of autotransformer 13 is stepped again. This cycle is repeated until a match is made.

In the foregoing description search counter 25 counts in one direction only, i.e., in the upward direction. Thus, if the actual match condition could be obtained at a lower count, the counter 25 still must count through its cycle until the match is obtained. This may result in several counts of counter 25 which could be avoided if the counter 25 was made to count in the opposite direction. Since counter 25 is an up/down counter, the phase of the reflection coefficient can be used to cause counter 25 to count in the appropriate direction, i.e., in the direction of the least number of counts to achieve a match.

The foregoing is accomplished by use of a phase detector 29 and a comparator 30 whose output may be connected to search counter 25 via switch 31. The phase detector 29 receives inputs of the voltages representative of forward and reflected voltages from bi-directional coupler 17 via conductors 18 and 19. Phase detector 29 measures the relative phase between the reflected and forward voltages which determines the phase of the reflection coefficient. An in-phase condition is indicative that the transformed load resistance is greater than the system characteristic impedance. An out-of-phase condition is indicative that the transformed load is less than the characteristic load impedance. This information appears on the output of phase detector 29 and is applied to comparator 30 where it is compared with an appropriate voltage bias. This bias is chosen to be at the median of the two extreme voltages representative of 180° phase difference, so that the comparator provides a first output value for phase differences at or near the in-phase condition and a second output value for phase differences approaching 180°. The output from comparator 30 is applied to counter 25 if switch 31 is closed. Counter 25 counts up in response to an out-of-phase condition or down in response to an in-phase condition of the forward and reflected voltages. This assures that counter 25 always counts in the direction which will relieve the mismatch condition in the most rapid manner.

Match change logic 32 which receives inputs via multiplexer 26 notes a change in the binar output of search counter 25 which means a change in the turns ratio of autotransformer 13 must take place. In this event match change logic 32 which provides an input terminal to R.F. generator 11 causes R.F. generator 11 to be turned off when the turns ratio change is actually being made, i.e., long enough for the relay drives 27 and 28 and relays 15 and 16 to effect a match turns ratio change.

When R.F. power is again turned on, the foregoing described mismatch correction is repeated if the new match ratio is still unacceptable. However, if an acceptable match has been effected, reflection coefficient comparator 23 has a low output and no further change in the turns ratio is made.

Timing logic 33 is utilized to perform the important timing functions of the present invention. Timing logic 33 as well as other important features of the present invention are described hereinafter in connection with FIG. 2.

Figure 2:
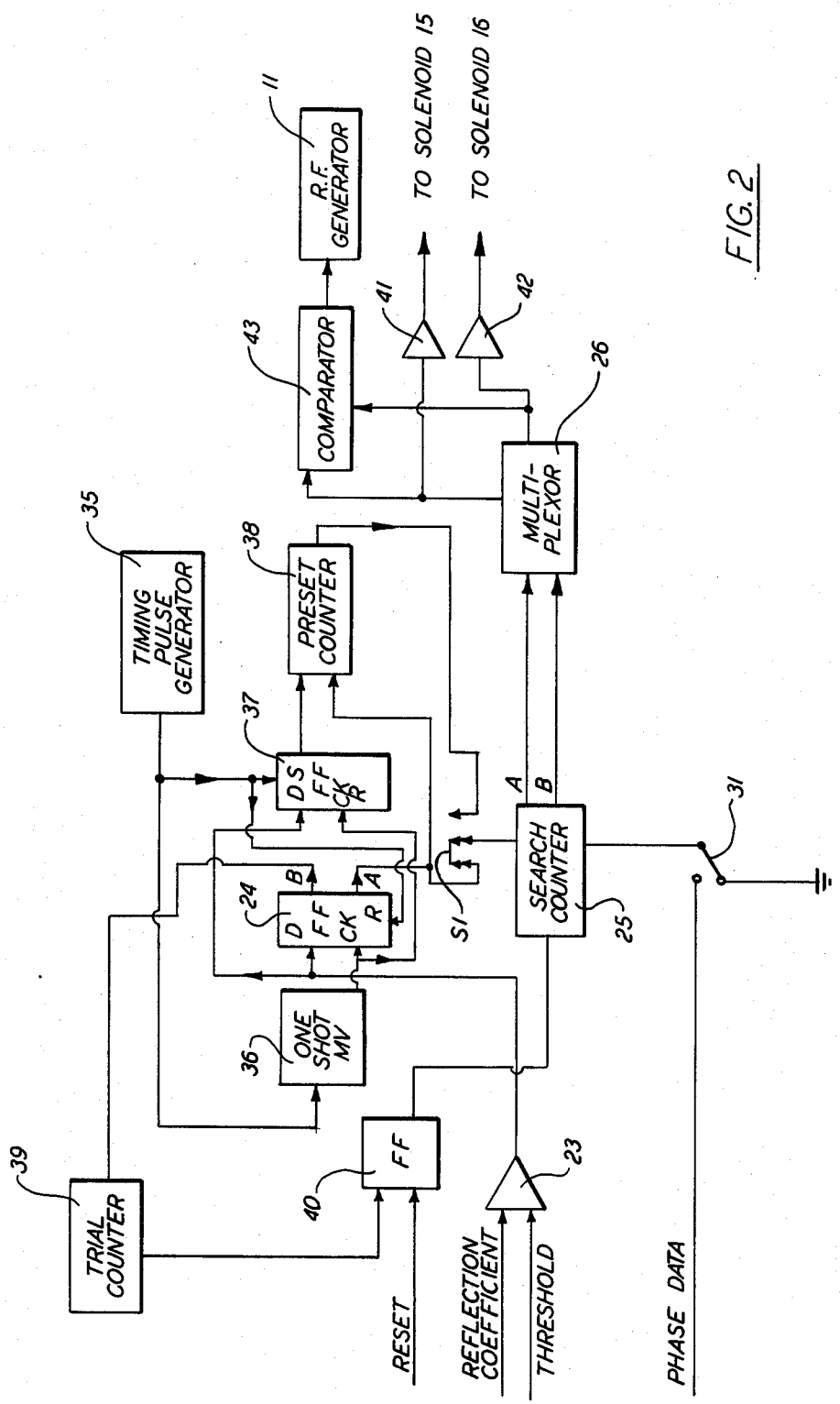
FIG. 2 is a more detailed showing of the match and timing control of the present invention.

FIG. 2 is a more detailed showing of the impedance match control system 10 of FIG. 1 and illustrates among other things the details of the timing logic 33 and the match change logic 32. In those instances where the components in FIG. 1 are the same as those in FIG. 2 like reference numerals are used.

In FIG. 2 there is shown a timing pulse generator 35. The timing pulse generator which provides timing pulses as shown in line 2 of the timing chart of FIG. 3 has its output connected to one shot multivibrator 36, the reset input of mismatch flip-flop 24 and the set input of match flip-flop 37.

The output from comparator 23 has its output connected to the data inputs of mismatch flip-flop 24 and match flip-flop 37. The comparator 23 which receives the input voltage representative of the reflection coefficient and the threshold voltage to which it is compared provides a high output only when a mismatch condition exists as illustrated in line 1 of the timing chart of FIG. 3.

One shot multivibrator 36 provides an input to the clock inputs of mismatch flip-flop 24 and match flip-flop 37. The input from one shot multivibrator is the clocking pulse shown in line 3 of the timing chart of FIG. 3. Each positive edge of the timing pulses from timing pulse generator 35 triggers the one shot multivibrator 36 to provide a negative pulse or low output pulse therefrom. Since it is a one shot multivibrator, the pulses from one shot multivibrator 36 terminate after a predetermined time which is substantially less than the timing pulses as shown in FIG. 3.

Output A of the mismatch flip-flop 24 is connected to search counter 25 via a switch $S_1$ when switch $S_1$ is in a first position as shown, i.e., when the system is in the immediate mode. Output A of the mismatch flip-flop 24 is also connected to preset counter 38. When switch $S_1$ is in its second position, i.e., when the system is in the delay mode, preset counter 38 is connected to search counter 25 and output A of the mismatch flip-flop 24 is not connected to the search counter 25.

The output of match flip-flop 37 is also connected to the preset counter 38.

Output B of the mismatch flip-flop 24 whose output pulse is the complement of the output pulse of output A is connected to a trial counter 39 which has an output connected to flip-flop 40 whose output is connected to the search counter 25. As is further explained below an appropriate output from the flip-flop 40 disables the search counter 25 and effectively stops the match sensing and correction cycle of the impedance match system of the present invention. The reset input to flip-flop 40 which may be manually operated serves to enable the search counter 25 again.

The flip flops 24 and 37 may be of the type No. SN 7474 manufactured by the Texas Instruments Corporation.

The search counter 25 provides binary outputs, i.e., 00,01, 10 or 11 multiplexer 26 which has outputs connected to solenoids 15 and 16 via amplifiers 41 and 42, respectively. As previously explained solenoid 15, when energized, actuates switch 14a and solenoid 16 when energized, actuate switches 14b and 14c of autotransformer 14 as shown in FIG. 1. The same outputs from search counter 25 are provided as inputs to comparator 43 via multiplexer 26. The comparator stores the previous binary inputs from search counter 25 and compares them with those being presented.

If the stored binary number matches those presented, a match has occurred. If, however, there is no match of the stored and presented binary numbers, a mismatch has been detected and the turns ratio of the autotransformer 13 will be changed in a manner to be discussed. Since a mismatch exists when the binary number presented is not the same as that stored, comparator 43 provides a pulse to turn off the R.F. generator 11 long enough to permit the turns ratio of the autotransformer 13 to be changed. This protects the switches 14a, 14b and 14c by permitting them to be switched in the absence of applied power. The R.F. power is off only during the existence of the pulse from comparator 43 which exists only long enough to permit the change in the turns ratio to be effected.

The switch 31 may be used to connect comparator 30 to the search counter 25 when it is desired to operate the search counter 25 in the phase sensitive mode to assure that it counts in the more appropriate direction as previously explained in connection with FIG. 1.

The operation of the impedance matching system of the present invention is now discussed when the system is in the immediate mode, i.e., when switch $S_1$ is in the position shown.

Timing pulse generator 35 provides the timing pulses as shown in line 2 of FIG. 3 to one shot multivibrator 36 to cause it to provide the clocking pulses shown in line 3 of FIG. 3. The positive edge of these pulses causes mismatch flip-flop 24 to be set only if a mismatch condition exists, i.e., a positive pulse or voltage as shown in line 1 of FIG. 3 exists at the data input D of mismatch flip-flop 24.

If a mismatch condition does not exist, then no pulse will exist at the data input of mismatch flip-flop 24 and no correction need be made.

However, assuming that a mismatch condition does exist then a pulse or voltage will be present at the data input of mismatch flip-flop 24 and the flip-flop will be set by the positive edge of the clocking pulse from one shot multivibrator 36. The flip-flop 24 is then reset by the next negative edge of the timing pulse. This event causes the search counter to count up by one providing a two bit binary number output on the outputs A and B of the search counter. This data in the form of pairs of pulses or no-pulses is fed to solenoids 15 and 16 to actuate switches 14a, 14b and 14c appropriately to change the turns ratio of the autotransformer 13 by one increment. Outputs A and B from search counter 25 and the corresponding outputs from multiplexer 26 are high or low d.c. values of voltage remaining in the given d.c. states corresponding to the binary number stored in the search counter 25. The effect of these d.c. states is to turn on or off d.c. solenoid currents in amplifier 41 and 42 and, thus, hold the solenoid conditions for any given count in search counter 25. As previously explained during the short time that the turns ratio change is being effected, the R.F. generator 11 is turned off.

If the turns ratio change effects a matched condition, the pulse or voltage from comparator 23 ceases and since the data input of mismatch flip-flop 24 no longer has a high, it will not be set and then reset, search counter 25 will not be incremented and no turns ratio change will be made.

However, if the effected turns ratio change does not result in a matched condition, the pulse or voltage will reappear at the data input of the mismatch flip-flop 24 and it will set and reset again to cause the search counter to count by one causing another turns ratio change. This cycling will continue until a match condition is effected or the autotransformer 13 reaches its limit. If the turns ratio reaches its limit without effecting a match, the system is shut down since it may then be assumed that something is wrong in the system. Counter 39 counts two complete four position matching trials. If a match fails to occur, counter 39 then trips flip-flop 40 which stops counter 25 from further trials. The output from flip-flop 40 could also sound an alarm or cause shutdown of other equipment.

The delay mode is initiated by changing the position of switch $S_1$ to connect an output of the preset counter 38 to the search counter 25. This mode is desirable when it is not necessary or desired to effect a turns ratio change each time a mismatch condition is detected. By use of preset counter 38 a turns ratio change is made only after a mismatch condition is detected a predetermined number of times. This eliminates, among other things, responses to false indications of a mismatch and requires that the mismatch be detected several times, e.g., five times before an effort to turn off the R.F. generator (which may seriously affect the particular etching process being performed) and effect a turns ratio change to correct mismatch.

In the delay mode the preset count 38 is set to a predetermined count and provides a pulse to search counter 25 to cause search counter 25 to increment by one to thus change its outputs on output lines A and B. This as previously explained changes the turns ratio of the autotransformer 13.

Thus, each time mismatch flip-flop 24 detects a mismatch, preset counter 38 is incremented by one. When preset counter 38 reaches its preset count, e.g., five, it provides a pulse to search counter 25 which is then incremented by one which results in a turns ratio change. This cycle is repeated until the mismatch condition is corrected, i.e., a turns ratio change is effected every fifth time a mismatch condition is detected by mismatch flip-flop 24. When the mismatch is corrected, the voltage or high represented in line 1 of the timing chart of FIG. 3 is no longer present at the data input of match flip-flop 37 whose output connected to preset counter 38 resets preset counter 38 to 0 by the pulse shown in line 5 of the timing chart. The match flip-flop 37 is only set when its data input is low by the positive edge of the clock pulse shown in line 3 and is reset by the negative edge of the timing pulse shown in line 23 of the timing chart of FIG. 3.

As can be understood on occurrence of the next mismatch, preset counter must be incremented five times to effect each turns ratio change of autotransformer 13.

As aforesaid, the complementary output of the mismatch flip-flop 24 is connected to trial counter 39. In the immediate mode trial counter 39 counts the number of times a mismatch correction occurs, and after a predetermined number of trials, the trial counter sets flip-flop 40 which in turn disables search counter 25. This effectively stops the mismatch correction operation. This is a desirable feature inasmuch as failure of the system to correct a mismatch after a few trials is probably indicative of a failure in the etching energization circuit. When this is the case, the automatic sensing and correction system is best shut down so that appropriate repairs may be made.

When it is desired to start the sensing and correction system again, flip flop 40 is reset.

Other modifications of the present invention are possible in light of the foregoing description which should not be construed as placing limitations on the invention beyond those limitations set forth in the claims which follow.

What is claimed is:

1. In a system for supplying R.F. power to a load, an automatic impedance matching system comprising;
   R.F. power source means;
   bidirectional coupler means connecting said R.F. power source means to the load, said bidirectional coupler means also providing separate output voltages proportional to incident and reflected power, respectively;
   autotransformer means connected between the load and said bidirectional coupler means;
   divider means connected to said bidirectional coupler means for receiving said output voltages proportional to incident and reflected power and providing an output voltage proportional to the reflection coefficient;
   a source of threshold voltage;
   comparator means connected to receive the outputs of said divider means and said source of threshold voltage and providing an output voltage indicative of a mismatch when said voltage proportional to the reflection coefficient is greater than said threshold voltage;
   first flip-flop means connected to said comparator means and providing output pulses each having a positive edge and a negative edge in response to said output voltage from said comparator means indicative of a mismatch,
   a search counter having a binary output,
   first switch means having a first position connecting said first flip-flop means to an input to said search counter for applying said pulses from said first flip-flop means to change the count of said search counter by one on each occurrence of a pulse from said first flip-flop means;
   second switch means coupling said autotransformer means to said bidirectional coupler means;
   solenoid means coupled to said second switch means;
   circuit means connected between said search counter means and said solenoid means energizing said solenoid means to actuate said second switch means for changing the turns ratio of said autotransformer means when the count in said search counter is changed on occurrence of a pulse from said first flip-flop means.

2. In a system according to claim 1 further including;
   preset counter means having an output operably connected to said search counter,
   said first switch means having a second position operably connecting said first flip-flop means to said preset counter,
   said preset counter providing an output pulse to said search counter to change the count of said search counter means only on the occurrence of a predetermined number of pulses from said first flip-flop means, the turns ratio of said autotransformer means being changed on each occurrence of a predetermined number of pulses from said first flip-flop means.

3. In a system according to claim 2 further comprising;
   timing pulse generator means providing continuously recurring timing pulses each having a positive edge and a negative edge of a first time period,
   one shot multivibrator means connected to said timing pulse generator means and responsive to said timing pulses to provide clocking pulses each having a positive edge and a negative of a second time period shorter than said first period,
   said first flip-flop means having a data input terminal connected to said comparator means for receiving said output voltage from said comparator means indicative of a mismatched, a clock input terminal connected to said one shot multivibrator means and a reset input terminal connected to said timing pulse generator such that when an output voltage exists on said data input terminal, said first flip-flop means is set by the positive edge of said clocking pulses and reset by the negative edge of said timing pulses,
   said search counter being changed in count by the negative edge of said pulse from said first flip-flop means.

4. In a system according to claim 3 further comprising;
   second flip-flop means having a data input, a clock input, a set input and an output, said data input being connected to said comparator, said clock input being connected to said one shot multivibrator, said set input connected to said timing generator and said output connected to said preset counter means such that when said comparator means has no output voltage said second flip-flop means is reset by the positive edge of said clocking pulses and set by the negative edge of said timing pulses, said preset counter being reset when said second flip-flop means is set.

5. In a system according to claim 4 further comprising;

phase detector means connected to said bidirectional coupler determining and providing an output voltage indicative of the phase relationship of said reflected and incident voltages, third switch means for connecting said phase detector means to said search counter whereby said search counter changes count in the up or down direction in response to an out-of-phase condition or an in-phase condition, respectively, of said incident and reflected voltages in response to said output voltage from said phase detector means.

6. In a system according to claim 5 further comprising;

means connected between said first flip-flop means and said search counter for disabling said search counter after a predetermined number of match trials.

7. In a system according to claim 3 further comprising;

phase detector means connected to said bidirectional coupler determining and providing an output voltage indicative of the phase relationship of said reflected and incident voltages, third switch means for connecting said phase detector means to said search counter whereby said search counter changes count in the up or down direction in response to an out-of-phase condition or an in-phase condition, respectively, of said incident and reflected voltages in response to said output voltage from said phase detector means.

8. In a system according to claim 7 further comprising;

means connected between said first flip-flop means and said search counter for disabling said search counter after a predetermined number of match trials.

* * * * *